(12) United States Patent
Garibin et al.

(10) Patent No.: US 6,673,150 B2
(45) Date of Patent: Jan. 6, 2004

(54) MULTICOMPARTMENT CONTAINER FOR GROWING CALCIUM FLUORIDE MONOCRYSTALS

(75) Inventors: Evgeny A. Garibin, St. Petersburg (RU); Aleksey A. Demidenko, St. Petersburg (RU); Boris I. Kvashnin, St. Petersburg (RU); Igor A. Mironov, St. Petersburg (RU); Gury T. Petrovsky, St. Petersburg (RU); Vladimir M. Reyterov, St. Petersburg (RU); Aleksandr N. Sinev, St. Petersburg (RU)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/124,545

(22) Filed: Apr. 16, 2002

(65) Prior Publication Data

US 2002/0190064 A1 Dec. 19, 2002

(51) Int. Cl.[7] ............................................. C30B 29/00
(52) U.S. Cl. ....................................... 117/223; 117/940
(58) Field of Search ................................ 117/940, 223, 117/200, 206

(56) References Cited

U.S. PATENT DOCUMENTS

| 4,030,965 | A | | 6/1977 | Hammond et al. |
|---|---|---|---|---|
| 5,178,719 | A | | 1/1993 | Pandelisev |
| 5,911,824 | A | | 6/1999 | Hammond et al. |
| 5,983,672 | A | | 11/1999 | Jinbo et al. |
| 6,123,764 | A | * | 9/2000 | Mizugaki et al. ............. 117/68 |
| 6,201,634 | B1 | | 3/2001 | Sakuma et al. |
| 6,332,922 | B1 | | 12/2001 | Sakuma et al. |
| 6,342,312 | B2 | | 1/2002 | Oba et al. |
| 2002/0117105 | A1 | * | 8/2002 | Chiba ......................... 117/200 |
| 2003/0019422 | A1 | * | 1/2003 | Herve .......................... 117/81 |
| 2003/0066477 | A1 | * | 4/2003 | Meyer-Fredholm et al. .. 117/81 |

* cited by examiner

Primary Examiner—Benjamin L. Utech
Assistant Examiner—Matthew Anderson
(74) Attorney, Agent, or Firm—Walter M. Douglas; Edward F. Murphy

(57) ABSTRACT

The invention provides a method of making UV<200 nm transmitting optical fluoride crystals for excimer laser lithography optics and a multicompartment container for growing optical fluoride crystals, comprising a number of graphite bowls that are placed on top of one another to form a stack and which have a central conical orifice in the bottom of each of them, and also comprising a seeding unit that has a central cylindrical orifice and is arranged under the lowermost bowl, characterized in the each bowl is fitted with a heat-removing device that is made in the form of a graphite cylinder with a central conical orifice, is mounted under the bottom of each bowl, and adjoins, with its other surface, the cover of the next bowl down, in which design the cover of each bowl, apart from the uppermost one, has a central conical orifice.

6 Claims, 1 Drawing Sheet

MULTICOMPARTMENT CONTAINER FOR GROWING CALCIUM FLUORIDE MONOCRYSTALS

CROSS-REFERENCE TO RELATED APPLICATIONS

This application is related to co-filed application, U.S. patent application Ser. No. 10/124,542, which is hereby incorporated by reference.

This application claims the benefit to priority under 35 U.S.C. §119 of Russian Federation Patent Application Serial No. 2001111055, filed Apr. 16, 2001.

BACKGROUND OF THE INVENTION

The present invention relates generally to optical fluoride crystals for transmitting below 200 nm UV region light, and particularly to UV region <200 nm transmitting calcium fluoride crystals for excimer laser lithography optics.

The present invention belongs to the technical field of preparing artificial crystals of optical-grade calcium fluoride by growing its monocrystals from a melt, cooling them in a temperature gradient, and using a crystal nucleus for the growth.

Optical-grade fluorite crystals are grown industrially by Stockbarger's method, in which a container (a crucible) containing the melt is moved through a temperature domain with a fixed gradient under a high vacuum in the presence of directional heat removal, which is generally ensured by a set of shields.

Cylindrical graphite containers with a conical or hemispherical bottom part are generally used for growing optical-grade crystals. Multichamber crucibles, consisting of a set of bowls in the form of a stack, are employed for the large-scale production of crystals, where an orifice is made in the bottom of each bowl to allow the melt to flow through. The number of bowls (vessels) depends partly on the size of the crystal-growing (working) zone of the apparatus and partly on the size of the intermediate crystals that are then to be grown to a larger size.

To grow the crystals in such crucibles, the whole stack of vessels is transferred, inside the crystallization furnace, from the melting zone to a zone where the temperature is kept below the crystallization temperature. The crystals growth begins in the lowest vessel and continues upward in each of the higher ones, as they successively traverse the crystallization isotherm (see pp. 106 and 107 in the Russian book entitled "Opticheskiy flyuorit" [Optical-Grade Fluorite] by N. P. Yushkin et al., published by Nauka in Moscow in 1983).

An example of the multicompartment crucible is represented by the apparatus described in a Japanese Patent Application entitled "Preparation of Calcium Fluoride Crystals" (see Japanese Patent Application No. 136515 of the Heisei Era 1.8 (1996), dated May 30, 1996 and published on Dec. 9, 1997/Japanese Patent Application—Kokei Series—No. 315893 of the Heisei Era 1.9 (1997)). In the apparatus described there, the stack consists of a set of bowls placed on top of one another. Each of these bowls is filled with the charge independently, and the bowls do not communicate with one another. The crystal growth occurs in each bowl separately, and independently of the process taking place in the other bowls.

In the prior-art apparatus that is the most like the object of the present invention is one comprising a "multistory" crucible, in which disk-shaped fluorite crystals are used as intermediate products for further growth (see p. 107 in the book "Optical Fluorite" by Yushkin et al., mentioned above). Each cavity (bowl) in this crucible has at its bottom a conical orifice to allow the melt to flow through from the higher cavity to the lower one, but this orifice is closed in the lowermost bowl.

During the crystallization of the melt, a penetrative growth (intergrowth) takes place through the orifice in the bottom of each bowl, and the small monocrystals thus formed serve as nuclei for the formation of monocrystalline intermediates in the cavities of the upper mold. The chances of a spontaneous formation of a crystal nucleus are practically nil here.

The main problem encountered in the preparation of crystals in the known apparatuses relates to the difficulty of obtaining high-quality optical-grade crystals that have a fixed crystallographic orientation, a low birefringence and a high optical uniformity. A rigorous crystallization regime or system must be used to make this preparation possible. The temperature domain must be so structures as to ensure the absence of any temperature gradients in the charge-melting zone, which guaranteeing a steep temperature gradient in the crystallization zone, and again none in the annealing zone.

In the prior art that is the most like the object of the present invention, the temperature domain with its special structure is created by heaters and a set of reflecting shields used to remove the heat. However, these means do not make it possible to obtain crystals that have the required orientation and a birefringence of less than 5–10 nm/cm.

SUMMARY OF THE INVENTION

An aspect of the present invention is to prepare calcium fluoride monocrystals that are oriented in a fixed crystallographic direction and have a low birefringence (less than 5 nm/cm) and a high optical uniformity, by means of a preferred additional removal of heat from the center of crystal formation.

An aspect of the invention is achieved by an improved construction of the multicompartment container, which consists of a) a number of graphite bowls, placed on top of one another, each of which is fitted with a central conical orifice in its bottom part, and b) a seeding until that has a central cylindrical orifice and is mounted under the bottom of the lowermost bowl. Unlike in the most similar prior art, each bowl of the container is fitted here with a heat-removing device in the form of a graphite cylinder. Each of these cylinders has a central conical orifice, is mounted under the bottom of each bowl, and adjoins, with its other surface, a flat piece that has a central conical orifice and serves as the cover or lid for the next bowl down.

DETAILED DESCRIPTION OF THE PREFERRED EMBODIMENTS

Reference will now be made in detail to the present preferred embodiments of the invention.

The diameter of the graphite cylinder is 0.5–0.7 times the diameter of the bottom of the bowl, and its height is 0.5–1.0 times the thickness of the bottom of the bowl, and the thickness of the cover or lid is 1.0–1.5 times the thickness of the bottom of the bowl. The conical orifices that are formed in the bottom of the bowls, in the graphite cylinders of the heat-removing devices, and in the covers can all be connected together to form a common conical orifice with an angle of taper of 10–20° and a diameter of 3–5 mm in its lower part.

The heat-removing device may form a single unit with the bottom of the corresponding bowl and with the cover of the next bowl down.

The seeding unit is closed with a stopper at the bottom.

In a preferred embodiment, the construction of the heat-removing unit guarantees the required ideal removal of the heat from the central part of the bottom of each bowl in an axial direction throughout the crystal-growing period, and this creates favorable conditions for growing monocrystals, relieving their internal stresses, and improving their uniformity.

The dimensions of the graphite cylinder of the heat-removing device and the cover of the bowl below are chosen so as to ensure the best parameters for the gradients of the temperature domain, in which the crystallization front of the growing crystal is planar or only slightly convex. A crystallization front having this shape minimizes the radial gradients in the growing crystal, as a result of which the stresses and deformations of the crystal lattice are also minimized.

Figure 1:
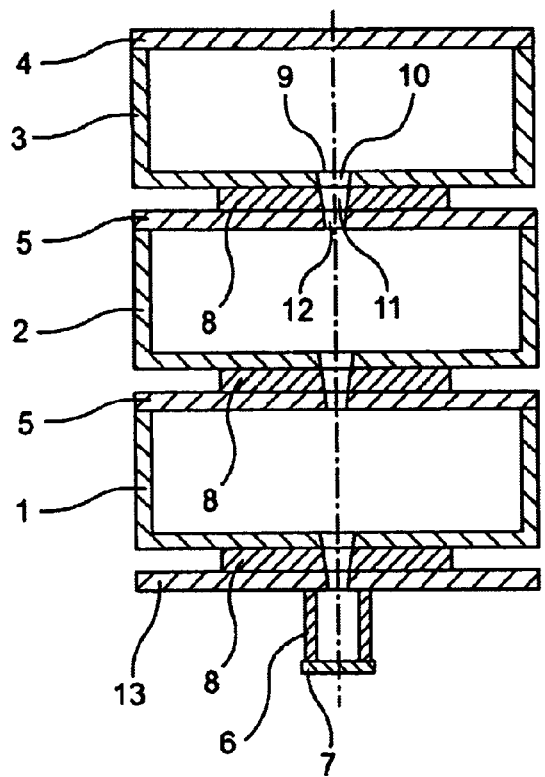
FIG. 1 shows a multicompartment crucible container in accordance with the invention.

FIG. 1 shows a diagram of the multicompartment container, where:

1 is the lowermost bowl

2 . . . –n are the successive bowls placed on top of one another to form a stack on the lowermost bowl (the number of these bowls may vary)

3 is the uppermost bowl, closed at the top with a cover

4 and

5 are the covers of the bowls below the top one

6 is the seeding unit

7 is the stopper closing the seeding unit at its bottom

8 is the heat-removing device in the form of a graphite cylinder

9 is a conical orifice formed by parts 10, 11 and 12, between the cavities of the bowls

10 is the central orifice in the bottom of each bowl

11 is the central orifice of the graphite cylinder 8

12 is the central orifice in the cover of each bowl, apart from the top one

13 is an optional extra component in the form of a flat piece that may be arranged under the bottom bowl and which has the same structure as the cover of the other bowls.

Figure 2:
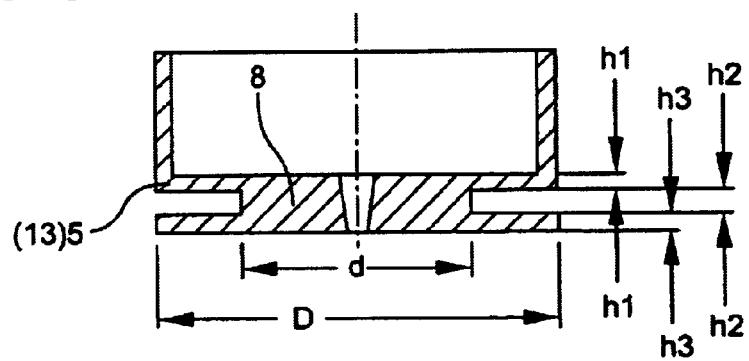
FIG. 2 shows a crucible container in accordance with the invention.

FIG. 2 shows one of the bowls of the container, which bowl is constructed so as to form a single unit with the heat-removing device 8 and with the cover 5 or the flat piece 13 mounted below the bowl. The resulting joint conical orifice has a diameter of 3–5 mm in its lower part, and an angle of taper of 10–20°.

All the bowls are made with the same dimensions, and the following relations hold for the various diameters:

$$d = (0.5-0.7) \cdot D$$

$$h_2 = (0.5-1.0) \cdot h_1$$

$$h_3 = (1.0-1.5) \cdot h_1$$

where $h_1$ is the thickness of the bottom bowl $h_2$ is the height of the heat-removing cylinder 8

$h_3$ is the thickness of the cover of each bowl

D is the outside diameter of the bottom of the bowl, and d is the outside diameter of the heat-removing cylinder 8.

All the parts of the container construction are made of graphite.

The technological process of growing crystals is carried out as follows. The nucleus, which is a crystal of the material to be grown and has the required orientation, is placed in the seeding unit 6, which the charge, consisting of the crystals to be grown, is placed in the bowls 1, 2 and 3. The container is introduced into the crystal-growing furnace, and the chamber of the furnace is evacuated to a residual pressure of at least $5 \times 10^{-5}$ mm Hg. The furnace is heated to the temperature at which the charge melts, and the container is then moved from the upper, hot zone to the lower, colder zone of the chamber of the furnace, whereby the melt undergoes crystallization.

This process gave calcium fluoride monocrystals with a diameter of 300 mm, a thickness of 70 mm, an optical uniformity of $(1-3) \times 10^{-6}$ and a birefringence of 1–3 nm/cm.

It will be apparent to those skilled in the art that various modifications and variation can be made to the present invention without departing from the spirit and scope of the invention. Thus it is intended that the present invention cover the modifications and variations of this invention provided they come within the scope of the appended claims and their equivalents.

What is claimed is:

1. A multicompartment container for growing calcium fluoride crystals, comprising a number of graphite bowls that are placed on top of one another to form a stack and which have a central conical orifice in the bottom of each of them, and also comprising a seeding unit that has a central cylindrical orifice and is arranged under the lowermost bowl, characterized in that each bowl is fitted with a heat-removing device that is made in the form of a graphite cylinder with a central conical orifice, is mounted under the bottom of each bowl, and adjoins, with its other surface, the cover of the next bowl down, in which design the cover of each bowl, apart from the uppermost one, has a central conical orifice.

2. A multicompartment container according to claim 1, characterized in that the outside diameter of the graphite cylinder is 0.5–0.7 times the diameter of the bottom of the bowl, the height of the graphite cylinder is 0.5–1.0 times the thickness of the bottom of the bowl, the thickness of the cover of each of the lower bows is 1.0–1.5 times the thickness of the bottom of the uppermost bowl, and the conical orifices of all the parts that can be connected together form a smooth passage with an angle of taper of 10–20°, the diameter of the cone in its lower part being 3–5 mm.

3. Multicompartment container according to claim 1 or 2, characterized in that the heat-removing device forms a single unit with the bottom of the bowl and the cover of the next bowl down.

4. A multicompartment container for growing optical fluoride crystals, comprising a number of graphite bowls that are placed on top of one another to form a stack and which have a central conical orifice in the bottom of each of them, and also comprising a seeding unit that has a central cylindrical orifice and is arranged under the lowermost bowl, and each bowl is fitted with a heat-removing device that is made in the form of a graphite cylinder with a central conical orifice, and is mounted under the bottom of each bowl, and adjoins, with its other surface, the cover of the next bowl down, and in which the cover of each bowl, apart from the uppermost one, has a central conical orifice.

5. A multicompartment container according to claim 4, wherein the outside diameter of the graphite cylinder is 0.5–0.7 times the diameter of the bottom of the bowl, the height of the graphite cylinder is 0.5–1.0 times the thickness of the bottom of the bowl, the thickness of the cover of each of the lower bows is 1.0–1.5 times the thickness of the bottom of the uppermost bowl, and the conical orifices of all the parts that can be connected together form a smooth passage with an angle of taper of 10–20°, the diameter of the cone in its lower part being 3–5 mm.

6. Multicompartment container according to claim 4 or 5, wherein the heat-removing device forms a single unit with the bottom of the bowl and the cover of the next bowl down.

* * * * *